United States Patent
Mamontov et al.

[11] Patent Number: 5,959,344
[45] Date of Patent: Sep. 28, 1999

[54] HIGH FORWARD CURRENT GAIN BIPOLAR TRANSISTOR

[75] Inventors: Yevgeny Mamontov, Mölndal; Magnus Willander, Linköping, both of Sweden

[73] Assignee: Forskarpatent i Linkoping AB, Linkoping, Sweden

[21] Appl. No.: 08/930,829

[22] PCT Filed: Apr. 9, 1996

[86] PCT No.: PCT/SE96/00456

§ 371 Date: Oct. 10, 1997

§ 102(e) Date: Oct. 10, 1997

[87] PCT Pub. No.: WO96/32748

PCT Pub. Date: Oct. 17, 1996

[30] Foreign Application Priority Data

Apr. 10, 1995 [SE] Sweden .................................. 9501317

[51] Int. Cl.⁶ .................................................. H01L 27/082
[52] U.S. Cl. ........................ 257/566; 257/593; 257/110; 257/163; 257/167
[58] Field of Search ..................................... 257/110, 163, 257/167, 566, 593

[56] References Cited

U.S. PATENT DOCUMENTS

| | | |
|---|---|---|
| 4,814,852 | 3/1989 | Sundstrom . |
| 4,843,448 | 6/1989 | Garcia et al. . |
| 5,032,887 | 7/1991 | Oliveri et al. . |
| 5,412,328 | 5/1995 | Male et al. ............................... 324/752 |
| 5,481,132 | 1/1996 | Moreau .................................... 257/566 |

FOREIGN PATENT DOCUMENTS

| | | |
|---|---|---|
| 0 476 308 A1 | 3/1992 | European Pat. Off. . |
| 0 476 308 B1 | 3/1992 | European Pat. Off. . |

OTHER PUBLICATIONS

Murphy et al., "Transistor–Transistor Logic with High Packing Density and Optimum Performance at High Inverse Gain", Session IV: Large–Scale Integration, ISSCC, International Solid–State Circuits Conference (Philadelphia, PA 1968), Digest of Technical Papers, Feb. 1968, pp. 002–003.

Primary Examiner—Olik Chaudhuri
Assistant Examiner—Douglas A. Wille
Attorney, Agent, or Firm—Pillsbury Madison & Sutro LLP

[57] ABSTRACT

A bipolar transistor includes an emitter, a base, a collector, an additional base semiconductor region having the same conductivity type as the base, arranged at the emitter and constituting a connection with the emitter. A first electrical connection connects the additional base semiconductor region with the base, thereby short-circuiting the additional base semiconductor region relative to the base, such that the additional base semiconductor region and base together constitute a combined base of the transistor. A further semiconducting collector region has the same conductivity type as the collector. A second electrical connection connects the further semiconductor connecting region and the collector, thereby short-circuiting the further semiconducting collector region and the collector, such that the additional semiconducting collector region and the collector together constitute a combined collector of the transistor.

1 Claim, 2 Drawing Sheets

HIGH FORWARD CURRENT GAIN BIPOLAR TRANSISTOR

BACKGROUND OF THE INVENTION

1. Field of the Invention

The present invention relates to a semiconductor bipolar transistors and, more particularly, to high-forward-current-gain transistors.

2. Prior Art

One of the most important parameters of semiconductor bipolar transistor in common-emitter configuration under stationary and normal-operating conditions is forward current gain. It is well-known that this parameter is inversely proportional to the flow $F_1$ of the charge carriers injected from the base region into the emitter region where these carriers are minority. This flow is usually directly proportional to the flow $F_2$ of the above minority carriers from the emitter region into the emitter-contact body. In particular, it forms the basis of the most popular technique to increase forward current gain in silicon and silicon-base homojunction or heterojunction transistors by means of decreasing flow $F_2$.

This technique applies polysilicon instead of metal as a material for the emitter contact. It usually increases the forward current gain by at least several times. A more noticeable improvement is achieved by application of a very thin interfacial dielectric layer between the monosilicon emitter region and the polysilicon emitter-contact body. This method contributes to a reduction of base-current density and thereby to a further increase of the forward current gain compared to the case of the absence of this layer. The thicker layer leads to higher values of the gain. If the layer is not thin enough, the minority carriers in the emitter region are blocked at the interface, i.e. the corresponding value of $F_2$ becomes quite close to zero. However, insufficiently thin layers block not only minority carriers but also majority carriers in the emitter region and thereby increase the total emitter resistance. The resistance problem is sometimes so sharp that special techniques are developed to breakup the interfacial dielectric layer that, to some extent, means a returning to the above "layerless" structure. The reason is that flow $F_2$ should not be forced to reach zero. This circumstance limits the prospects to achieve extremely high values of the forward current gain within the polysilicon-emitter-contact approach.

The above considerations can also be applied to semiconductor bipolar transistor in common-collector configuration. To do that, one should only replace word "emitter" with word "collector" and vice versa.

The present invention is based on a qualitatively different idea. As noted above, the emitter-region minority carriers are injected from the base region (flow $F_1$) and flow through the emitter region to the emitter contact (flow $F_2$). The present invention proposes the method which provides the opposite direction of flow $F_2$. In this case, the minority carriers are injected into the emitter region not only from the base region to the emitter-region surface which is opposite to the emitter-base interface but also from the above surface to this interface. It can be shown that this counter-injection provides higher values of forward current gain of the transistor than any version of the polysilicon emitter contact.

SUMMARY OF THE PRESENT INVENTION

The object of the present invention is to provide an extra semiconductor structure for semiconductor bipolar transistors which, being included in a transistor, provides the following advantages:

improvement in the device forward-current-gain performance under stationary and normal-operating conditions without a noticeable deterioration of transient properties of the device compared to existing bipolar technologies, possibly to be fabricated in various materials and technologies including standard commercial silicon homojunction or silicon-based heterojunction processes, and better immunity to a degradation of the above forward current gain at cryogenic temperatures.

Any semiconductor bipolar transistor usually includes at least one collector region, at least one base region, and at least one emitter region. All the collector and emitter regions have the same type of conductivity whereas all the base regions have the opposite type of conductivity. The above-mentioned objects may be achieved by providing a semiconductor bipolar transistor which includes an extra base-collector structure or an extra base-emitter structure.

An extra base-collector structure comprises: an extra base semiconductor region of the same type of conductivity as a conductivity type of one of the base regions of the transistor, being arranged at one of the emitter-regions of the transistor so as to form a junction with said emitter region; a first electrical connection being implented in any suitable material and technique and connecting the extra base region and the base region to electrically short the extra base region and the base region which thereby form a composite base of the transistor; an extra collector semiconductor region of the same type of conductivity as a conductivity type of one of the collector region of the transistor, being arranged at the extra base region so as to form a junction with the extra base region in such a way that thickness of quasi-neutral part of the extra base region in the direction from the extra collector region to the emitter region (or in the opposite direction) is much less than diffusion length of minority charge carriers in the extra base region; a second electrical connection being implented in any suitable material and technique and connecting the extra collector region and the collector region to electrically short the extra collector region and the collector region which thereby form a composite collector of the transistor.

An extra base-emitter structure for a semiconductor bipolar transistor has a description which is obtained from the above description of the extra base-collector structure by means of a replacing word "emitter" with word "collector" and vice versa therein.

A semiconductor bipolar transistor with the extra base-collector or base-emitter structure is intended to provide high values of the forward current gain in common-emitter or common-collector configurations respectively.

DETAILED DESCRIPTION

Figure 1:
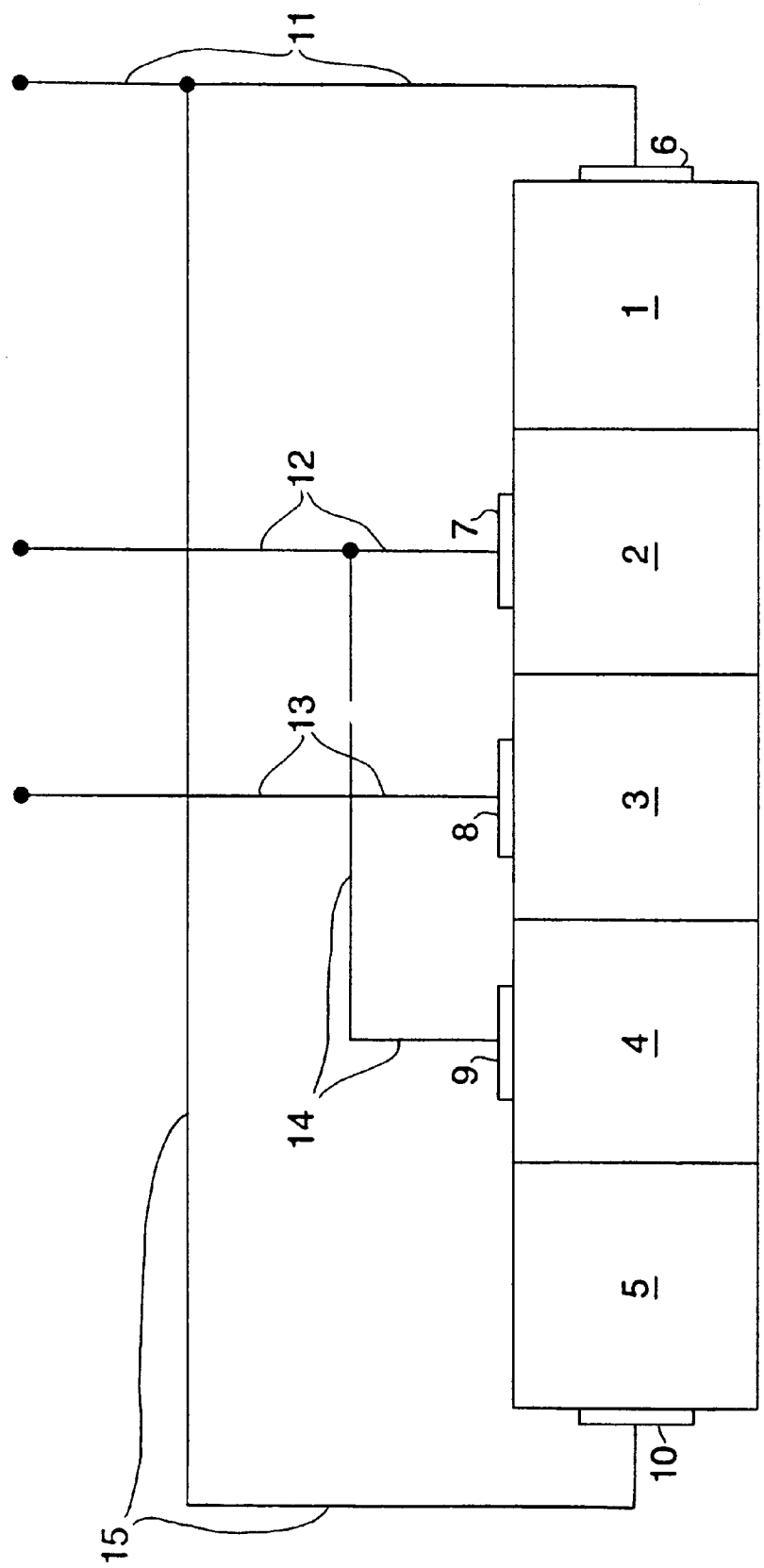
FIG. 1 presents a prototype semiconductor bipolar transistor with an extra base-collector structure and illustrates the present invention in the most simple way.

The best way to illustrate a general idea of the present invention is to show the invented extra semiconductor structure incorporated into a semiconductor bipolar transistor in the form of a prototype device, since prototype devices are commonly applied to demonstrate the most important constructive features of any bipolar transistor. The above mentioned prototype device is shown in FIG. 1.

Region 1 is one of the collector regions of the transistor. This region is of a first type of conductivity and has a collector lead 11 which includes a collector contact 6. Please note that contact 6 and all other contacts 7–10 (see below) are parts of the corresponding leads 11–15 and are shown as specific bodies only for convenience. Region 2 is one of the base regions of the transistor. This region is of a second type of conductivity, which is opposite to the conductivity type of collector region 1. Base region 2 has base lead 12 which includes base contact 7. Region 3 is one of the emitter regions of the transistor. This region is of a first type of conductivity and has an emitter lead 13 which includes an emitter contact 8.

Regions 4 and 5 and electrical connections 14 and 15 (including contacts 9, 10) are invented in the present invention. Semiconductor region 4 is an extra base region. This region is of a second type of conductivity and has an extra-base contact 9 which is a part of the electrical connection 14 connecting the extra-base region 4 with base lead 12 (or base contact 7 directly). Due to connection 14, base lead 12 is common for both base region 2 and extra base region 4. Semiconductor region 5 is an extra collector region. This region is of a first type of conductivity and has extra-collector contact 10 which is a part electrical connection 15 connecting extra-collector region 5 with collector lead 11 (or collector contact 6 directly). Due to connection 15, collector lead 11 is common for both collector region 1 and extra collector region 5. Region 5 is formed in such a way that the thickness of a quasi-neutral part of extra base region 4 in the direction from region 3 to region 5 (or in the opposite direction) is much less than diffusion length for minority carriers in region 4. One should also note that any of the electrical connections 14 and 15 (including contacts 9, 10) can generally be implemented by means of various processes and in various materials including metals, monocrystalline or polycrystalline semiconductors, and others.

It can be shown that, under stationary and normal-operating conditions, transistor in FIG. 1 always provides the counter-injection of minority carriers into region 3 (see the last paragraph in BACKGROUND OF THE INVENTION), that is the simultaneous injections of the carriers from both regions 2 and 4.

The figure for a prototype semiconductor bipolar transistor with extra base-emitter structure is exactly the same as FIG. 1. The corresponding description is easily obtained from the above description of FIG. 1 by means of replacing "collector" with word "emitter" and vice versa therein.

Figure 2:
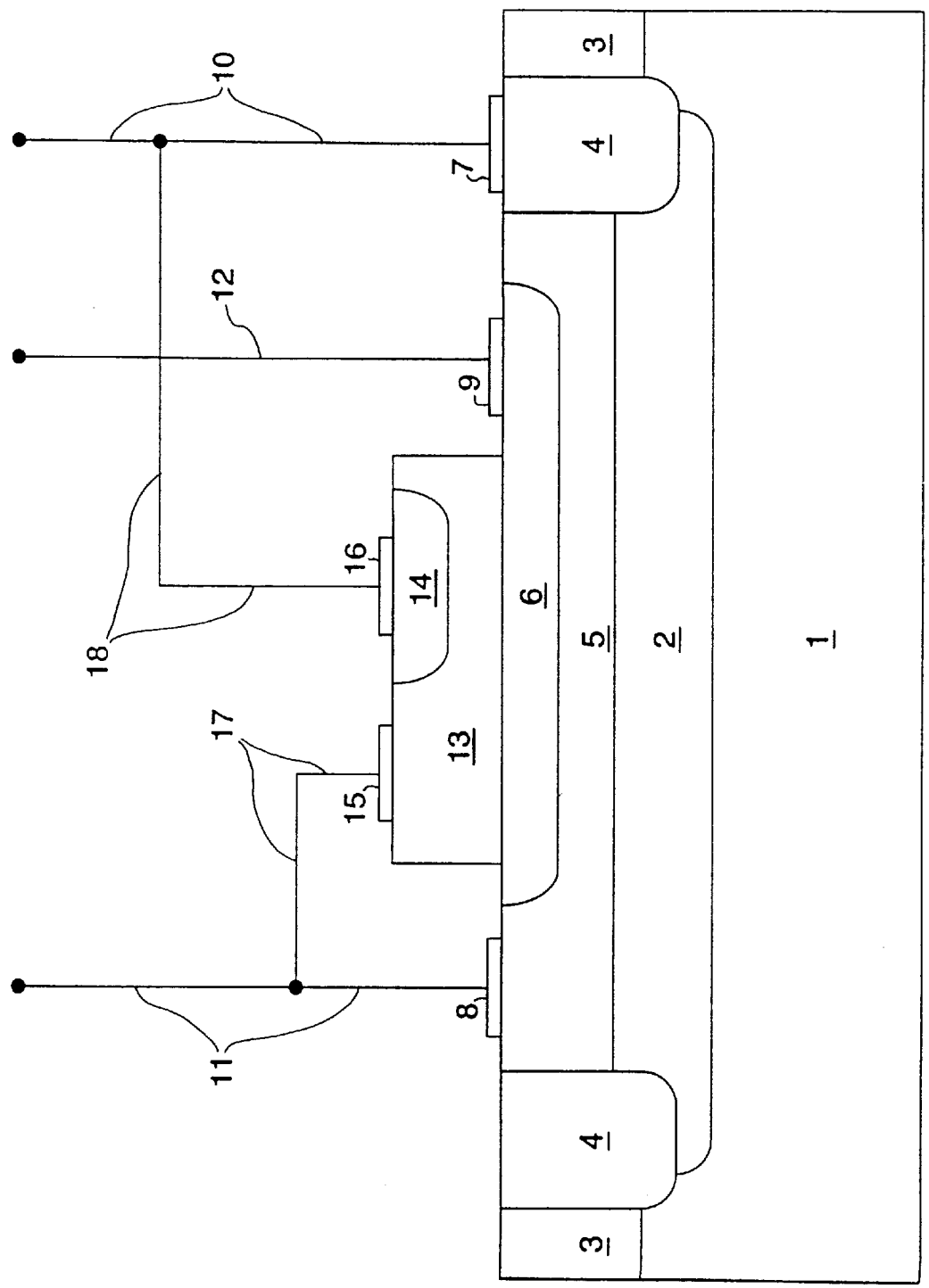
FIG. 2 is a cross-sectional view of a semiconductor bipolar transistor which is a particular example of embodiment of the device of FIG. 1, and combines the extra base-collector structure with the well-known collector diffusion-isolation transistor proposed by B. T. Murphy and V. J. Glinski, "Transistor-transistor logic with high-packing density and optimum performance at high inverse gain", *ISSCC Digest of Technical Papers*, pp. 38–39, February 1968.

A semiconductor bipolar transistor with the invented extra base-collector or extra base-emitter structure shown in FIG. 1, can generally be implemented as a vertical, lateral, or thin-film device, within homojunction or heterojunction technologies, by means of various materials and processes. One of many embodiments is shown in FIG. 2. This figure shows a cross-sectional view of the semiconductor bipolar transistor which combines a specific embodiment of the invented extra base-collector structure with the well-known collector-diffusion-isolation device proposed by B. T. Murphy and V. J. Glinksi, "Transistor-transistor logic with high-packing density and optimum performance at high inverse gain", *ISSCC Digest of Technical Papers*, pp. 38–39, February 1968.

In FIG. 2, a bulk substrate of a first type of conductivity is denoted by reference numeral 1. Region 2 is a burried region of a second type of conductivity, which is opposite to the conductivity type of substrate 1. Region 2 is formed by selective diffusion or ion implantation of an appropriate impurity into substrate 1. Layer 3 (including its part 5 (see below)), of a first type of conductivity, is epitaxially grown on substrate 1. Region 4 is a subcontact collector region. This region is of a second type of conductivity, and has a collector lead 10 which includes a collector contact 7. Please note that contact 7 and all other contacts 8, 9, 15, 16 (see below) are parts of the corresponding leads 10–12, 17, 18 and are shown as specific bodies only for convenience. Region 4 is formed by selective diffusion or ion implantation of an appropriate impurity into epitaxial layer 3, along the periphery or burried region 2, so as to surround part 5 of the layer which is over region 2 and thereby to isolate region 5 from another part of the layer. Subcontact collector region 4 and buried region 2 composes a collector region. Region 5 is base region. This region has base lead 11 which includes base contact 8. Region 6 is an emitter region. This region is formed by selective diffusion or ion implantation of an impurity of a second type of conductivity into region 5, and has emitter lead 12 which includes emitter contact 9.

The described part of the transistor in FIG. 2 has been invented by B. T. Murphy and V. J. Glinski and is disclosure, in the respective above identified reference. Regions 13 and 14 and electrical connections 17 and 18 (including contacts 15, 16) are provided in accordance with principles of the present invention. They are specific embodiments of regions 4, 5 and electrical connections 14, 15 (with contacts 9, 10) in FIG. 1 respectively. In FIG. 2, semiconductor region 13 is an extra base region. This region is of a first type of conductivity and has extra-base contact 15 which is a part of electrical connection 17 connecting extra base region 13 region 13 with base lead 11 (or with base contact 8, directly). Due to connection 17, base lead 11 is common for both base region 5 and extra base region 13. Extra base region 13 is formed as an "island"-like part of an epitaxially grown semiconductor layer. This "island" can be fabricated by the same operation as epitaxial layer 3 (including its base part 5) with subsequent selective etching of the resulting epitaxial layer. Semiconductor region 14 is an extra collector region. This region is formed by selective diffusion or ion implantation of an impurity of a second type of conductivity into extra-base region 13, and has extra-collector contact 16 which is a part of electrical connection 18 connecting extra region 14 with collector lead 10 (or with collector contact 7, directly). Due to connection 18, collector lead 10 is common for both collector regions 4, 2 and extra collector region 14. Region 14 is formed in such a way that the thickness of a quasi-neutral part of extra base region 13 in the direction from region 6 to region 14 (or in the opposite direction) is much less than diffusion length for minority carriers in region 13. One should also note that any of electrical connections 17 and 18 (including the corresponding contacts 15 and 16) can generally be implemented by means of various processes and in various materials including metals, monocrystalline or polycrystalline semiconductors, and others.

The semiconductor bipolar transistor with extra base-collector structure shown in FIG. 2 may include further details and helpful modifications. For instance, B. T. Murphy and V. J. Glinski respective in the above identified reference proposed to apply non-selective diffusion of impurity of a first type of conductivity into epitaxial layer 3 including its region 5 before formation of emitter region 6 to create a shallow subsurface layer. The purpose of this shallow layer is to provide a built-in electric field which inhibits the flow of minority carriers in base region 5 toward the surface and also to suppress lateral injection from emitter region 6. The both factors contribute to an increase of forward current gain of the device. Since, according to B. T. Murphy and V. J. Glinski, the above mentioned non-selective diffusion is not always necessary, the resulting shallow layer is not indicated in FIG. 2. Another modification presents selective diffusion or ion implantation of an impurity of a first type of conductivity into both base region 5 and extra base region 13 to form the corresponding subcontact low-resistivity regions to reduce series resistances of regions 5 and 13. However, these special subcontact regions are not indicated in FIG. 2 either, because they are meaningful only if regions 5 and 13 are low or medium doped.

Within silicon technology, compared to a conventional polysilicon-emitter-contact device, the bipolar transistor in FIG. 2 involves an additional semiconductor structure, namely, the extra base-collector structure 13–18. Nevertheless, the proposed construction does not lead to a deterioration of predictability and reproducibility of the device parameters since it is based on the common technological operations (see above). Besides, the invented transistor performs the above-formulated counter-injection effect granted by the extra base-collector structure, and hence makes application of polysilicon instead of metal as a material for emitter contact 12 unnecessary for high forward-current-gain performance. On the contrary, application of the metal contact has the advantage that it enables to avoid the polysilicon-contact fabrication which is not always easily controlled and optimized (see BACKGROUND OF THE INVENTION). So, in the metal-emitter-contact case, the predictability and reproducibility can be expected to be better than in the case of polysilicon emitter contact.

FIG. 2 demonstrates a specific embodiment of incorporation of the invented extra semiconductor structure into only one of the existing semiconductor bipolar transistors. Obviously, this structure can be included in other existing bipolar devices or can become a helpful element in future devices without departing from the scope of the invention.

We claim:

1. A bipolar transistor, comprising:

an emitter;

a base;

a collector;

an additional base semiconductor region having a same conductivity type as said base; said additional base semiconductor region being arranged at said emitter and constituting a connection with said emitter;

a first electrical connection connecting said additional base semiconductor region with said base, and thereby short-circuiting said additional base semiconductor region relative to said base, such that said additional base semiconductor region and said base together constitute a combined base of said transistor;

an additional semiconducting collector region having a same conductivity type as said collector; said additional semiconducting collector region being arranged at said additional base semiconductor region and constituting a connection with said additional base semiconductor region such that the thickness of a quasi-neutral part of said additional base semiconductor region, away from said additional semiconducting collector region, to said emitter, is much less than the diffusion length of minority charge carriers in said additional base semiconductor region; and a second electrical connection connecting said additional semiconducting collector region and said collector, and thereby short-circuiting said additional semiconducting collector region and said collector, such that said additional semiconducting collector region and said collector together constitute a combined collector of said transistor.

* * * * *